United States Patent
Cowles et al.

(10) Patent No.: US 6,310,819 B1
(45) Date of Patent: Oct. 30, 2001

(54) METHOD AND APPARATUS FOR CONTROLLING THE OPERATION OF AN INTEGRATED CIRCUIT RESPONSIVE TO OUT-OF-SYNCHRONISM CONTROL SIGNALS

(75) Inventors: Timothy B. Cowles; Jeffrey P. Wright, both of Boise, ID (US); Hua Zheng, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/703,496

(22) Filed: Oct. 31, 2000

Related U.S. Application Data

(60) Continuation of application No. 09/291,414, filed on Apr. 13, 1999, now Pat. No. 6,141,290, which is a division of application No. 08/918,614, filed on Aug. 22, 1997, now Pat. No. 5,999,481.

(51) Int. Cl.$^7$ ...................................................... G11C 7/00
(52) U.S. Cl. .............. 365/230.06; 365/233; 365/230.01; 365/191; 365/222
(58) Field of Search .................. 365/189.01, 230.01, 365/230.03, 230.06, 233, 191, 194, 222

(56) References Cited

U.S. PATENT DOCUMENTS

| | | | |
|---|---|---|---|
| 5,463,590 | 10/1995 | Watanabe | 365/230.03 |
| 5,587,961 | 12/1996 | Wright et al. | 365/233 |
| 5,600,605 | 2/1997 | Schaefer | 365/233 |
| 5,627,791 | 5/1997 | Wright et al. | 365/222 |
| 5,629,897 | 5/1997 | Iwanmoto et al | 365/195 |
| 5,636,173 | 6/1997 | Schaefen | 3658/230.3 |
| 5,703,831 | 12/1997 | Sawada | 365/233 |
| 5,708,611 | * 1/1998 | Iwamoto et al. | 365/195 |
| 5,754,557 | 5/1998 | Andrewartha | 714/718 |
| 5,796,669 | * 8/1998 | Araki et al. | 365/222 |
| 5,812,492 | * 9/1998 | Yamauchi et al. | 365/233.5 |
| 5,818,777 | 10/1998 | Seyyedy | 365/222 |
| 5,870,350 | 2/1999 | Bertin et al. | 365/233 |
| 5,901,101 | 5/1999 | Suzuki et al. | 365/222 |
| 5,912,858 | 6/1999 | Tomita et al. | 365/222 |
| 5,955,905 | 9/1999 | Idei et al. | 327/160 |
| 5,986,964 | 11/1999 | Ariki et al. | 365/233 |
| 5,999,472 | 12/1999 | Sakurai | 365/222 |
| 5,999,481 | * 12/1999 | Cowles et al. | 365/233 |
| 6,026,041 | * 2/2000 | Suzuki et al. | 365/203 |
| 6,049,502 | * 4/2000 | Cowles et al. | 365/230.03 |
| 6,088,762 | 7/2000 | Creta | 711/106 |
| 6,119,200 | 9/2000 | George | 711/106 |
| 6,134,169 | 10/2000 | Tanaka | 365/222 |
| 6,141,290 | * 10/2000 | Cowles et al. | 365/230.06 |
| 6,229,749 | * 5/2001 | Cowles et al. | 365/222 |

FOREIGN PATENT DOCUMENTS

| | | | |
|---|---|---|---|
| 405144269 | * | 6/1993 | (JP) . |
| 408045277 | * | 2/1996 | (JP) . |
| 410055674 | * | 2/1998 | (JP) . |
| 410177787 | * | 6/1998 | (JP) . |

* cited by examiner

*Primary Examiner*—Viet Q. Nguyen
(74) *Attorney, Agent, or Firm*—Dorsey & Whitney LLP

(57) ABSTRACT

A self refresh decoder generates a self refresh command as long as the clock enable signal transitions low within a predetermined latency period after an auto refresh command is generated. As a result, an SDRAM is able to enter the self refresh mode even though the clock enable control signal differentiating the auto refresh command from the self refresh command is excessively delayed beyond the other control signals corresponding to both the auto refresh and the self refresh commands. The self refresh decoder includes a counter that is preloaded with a latency value and decrements to a terminal count responsive to the auto refresh command to terminate the latency period. The output of the counter is decoded to provide an enable signal as long as the terminal count has not been reached. As long as the enable signal is present, the self refresh command is generated responsive to receipt of the clock enable signal.

11 Claims, 5 Drawing Sheets

METHOD AND APPARATUS FOR CONTROLLING THE OPERATION OF AN INTEGRATED CIRCUIT RESPONSIVE TO OUT-OF-SYNCHRONISM CONTROL SIGNALS

CROSS-REFERENCE TO RELATED APPLICATION

This application is a continuation of U.S. patent application No. 09/291,414, filed Apr. 13, 1999, now U.S. Pat. No. 6,141,290 which is a divisional of U.S. patent application No. 08/918,614, filed Aug. 22, 1997, U.S. Pat. No. 5,999,481.

TECHNICAL FIELD

This invention relates to integrated circuits, and more particularly to a method and apparatus for allowing integrated circuits to respond to a combination of control signals in which one or more of the control signals may be excessively delayed relative to other signals in being applied to the integrated circuit.

BACKGROUND OF THE INVENTION

One of the problems that the preferred embodiment of the invention may alleviate will be explained with reference to a conventional synchronous dynamic random access memory ("SDRAM") 2 shown in FIG. 1. The operation of the SDRAM 2 is controlled by a command decoder 4 responsive to high level command signals received on a control bus 6. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, in which the "*" designates the signal as active low. The command decoder 4 generates a sequence of command signals responsive to the high level command signals to carry out the function (e.g., a read or a write) designated by each of the high level command signals. These command signals, and the manner in which they accomplish their respective fictions, are conventional. Therefore, in the interest of brevity, a further explanation of these control signals will be omitted.

The SDRAM 2 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which decodes the row address and applies corresponding signals to one of the arrays 20 or 22.

The row address multiplexer 18 also couples row addresses to the row address latches 26 for the purpose of refreshing the memory cells in the arrays 20, 22. The row addresses are generated for refresh purposes by a refresh counter 30 which is controlled by a refresh controller 32. The refresh controller 32 is, in turn, controlled by the command decoder 4. More specifically, the command decoder 4 applies either a refresh command RE, an auto refresh command AR, or a self refresh command SR to the refresh controller 32. As explained below, these three commands applied to the refresh controller 32 cause the refresh controller to refresh the rows of memory cells in the arrays 20, 22 in one of three corresponding modes, namely a refresh mode, an auto refresh mode, or a self refresh mode. These modes are described in greater detail below. The commands applied to the refresh controller 32 correspond to respective combinations of the control signals applied to the command decoder 4, as also described in detail below.

After the row address has been applied to the address register 12 and stored in one of the row address latches 26, a column address is applied to the address register 12. The address register 12 couples the column address to a column address latch 40. Depending on the operating mode of the SDRAM 2, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48 which applies various column signals to corresponding sense amplifiers and associated column circuitry 50, 52 for one of the respective arrays 20, 22.

Data to be read from one of the arrays 20, 22 is coupled to the column circuitry 50, 52 for one of the arrays 20, 22, respectively. The data is then coupled to a data output register 56 which applies the data to a data bus 58. Data to be written to one of the arrays 20, 22 is coupled from the data bus 58 through a data input register 60 to the column circuitry 50, 52 where it is transferred to one of the arrays 20, 22, respectively. A mask register 64 may be used to selectively alter the flow of data into and out of the column circuitry 50, 52 such as by selectively masking data to be read from the arrays 20, 22.

As mentioned above, the SDRAM 10 shown in FIG. 1 includes a refresh controller that is used to periodically refresh the memory cells in the arrays 20, 22. The refresh controller 32 operates in a variety of modes, two of which are the auto refresh mode and the self refresh mode as mentioned above. In the auto refresh mode, the refresh controller 32 causes the SDRAM 2 to address each row of memory cells in the array using the refresh counter 30 to generate the row addresses. Thus, in the auto refresh mode, it is not necessary for an external device to apply addresses to the address bus 14 of the SDRAM 2. However, the auto refresh command must be applied to the SDRAM 2 periodically and often enough to prevent the loss of data stored in the memory cells of the arrays 20, 22.

The self refresh mode is essentially the same as the auto refresh mode except that it is not necessary to periodically apply a command to the SDRAM 2 from an external device at a rate sufficient to prevent data loss. Instead, once the refresh controller 32 is placed in the self refresh mode, it automatically initiates an auto refresh with sufficient frequency to prevent the loss of data from the memory cells of the arrays 20, 22.

As mentioned above, the auto refresh command AR and self refresh command are applied to the refresh controller 32 from the command decoder. The command decoder generates the auto refresh and the self refresh command from the chip select ("CS*"), row address strobe ("RAS*"), column address strobe ("CAS*"), write enable ("WE"), and clock enable ("CKE") control signals.

The combination of control signals corresponding to the auto refresh command and the self refresh command are illustrated in FIG. 2 along with a clock signal ("CLK")

which registers the appropriate command at $t_0$. As shown in FIG. 2, the first four control signals, namely CS*, RAS*, CAS* and WE, are the same for both the auto refresh and the self refresh commands. To assert either of these commands, CS*, RAS*, and CAS* must all be active low and WE must be active high. The final control signal, CKE, determines whether the command decoder will generate an auto refresh command or a self refresh command. If CKE is high at $T_0$, the command decoder applies an auto refresh command AR to the refresh controller 32. If CKE is low at $t_0$, the command decoder applies a self refresh command SE to the refresh controller 32.

A particular problem encountered with higher speed SDRAMs is a difficulty in applying all of the control signals to the SDRAM 2 at the proper time. As the operating speed of SDRAMs continues to increase, the "window" during which all of the control signals must be present continues to decrease. The problem is particularly acute for control signals that are routed to a variety of SDRAMs in a system or to a variety of locations on an SDRAM because of the relatively large capacitive loading of such signals. Even though all of the control signals may be generated at the same time, signals that are capacitively loaded to a relatively large degree will be coupled with a relatively large delay.

One of these signals that is capacitively loaded to a degree greater than other signals is CKE. For this reason, when the SDRAM 2 control signals attempt to cause the command generator 4 to place in the self refresh mode, the CKE signal can be delayed excessively so that it does not go low at the same time the other control signals constituting the self refresh command are active. As a result, the command generator 4 will improperly register these as a control signals auto refresh command rather than a self refresh command.

Although the problem of excessive delays has been explained with reference to the self refresh command in an SDRAM, similar problems exist for other commands in SDRAMs and other signals in other memory devices as well as in integrated circuits other than memory devices. There is therefore a need to be able to properly interpret a combination of signals even though one or more of the signals is present earlier or later than the remaining control signals.

SUMMARY OF THE INVENTION

A method and apparatus for causing an integrated circuit to perform first and second functions responsive to respective first and second combinations of control signals even though at least one of the control signals in the first and second combinations is out of synchronism with the remaining control signals in the first or second combination. A first decoder decodes the control signals to determine if the first combination of control signals have been applied to the integrated circuit. If so, the first decoder generates a first command signal corresponding to the first combination of control signals. Before or after detecting the first combination of control signals, a second decoder checks control signals to determine if the second combination of control signals is received. If the second combination of control signals has been received with predetermined criteria, the second decoder generates a second command signal to cause the integrated circuit to perform the second function.

The predetermined criteria may be the time or number of clock cycles between detecting the first and second combinations of control signals, or some other criteria. The second decoder may include a logic circuit coupling a clock signal to a clock input of a counter responsive to the first command signal. The counter may then generate an enable signal until the counter has been incremented or decremented by a predetermined value. A second logic circuit generates the second command signal responsive receiving both the enable signal and the second combination of control signals. In the event that the integrated circuit is a synchronous dynamic random access memory, the control signals corresponding to an auto refresh command can be detected and used to start a predetermined self refresh latency period. As long as a clock enable signal is detected during the self refresh latency period, a self refresh command is generated. If a clock enable signal is not detected during the self refresh latency period, an auto refresh command is generated.

DETAILED DESCRIPTION OF THE INVENTION

Figure 1:
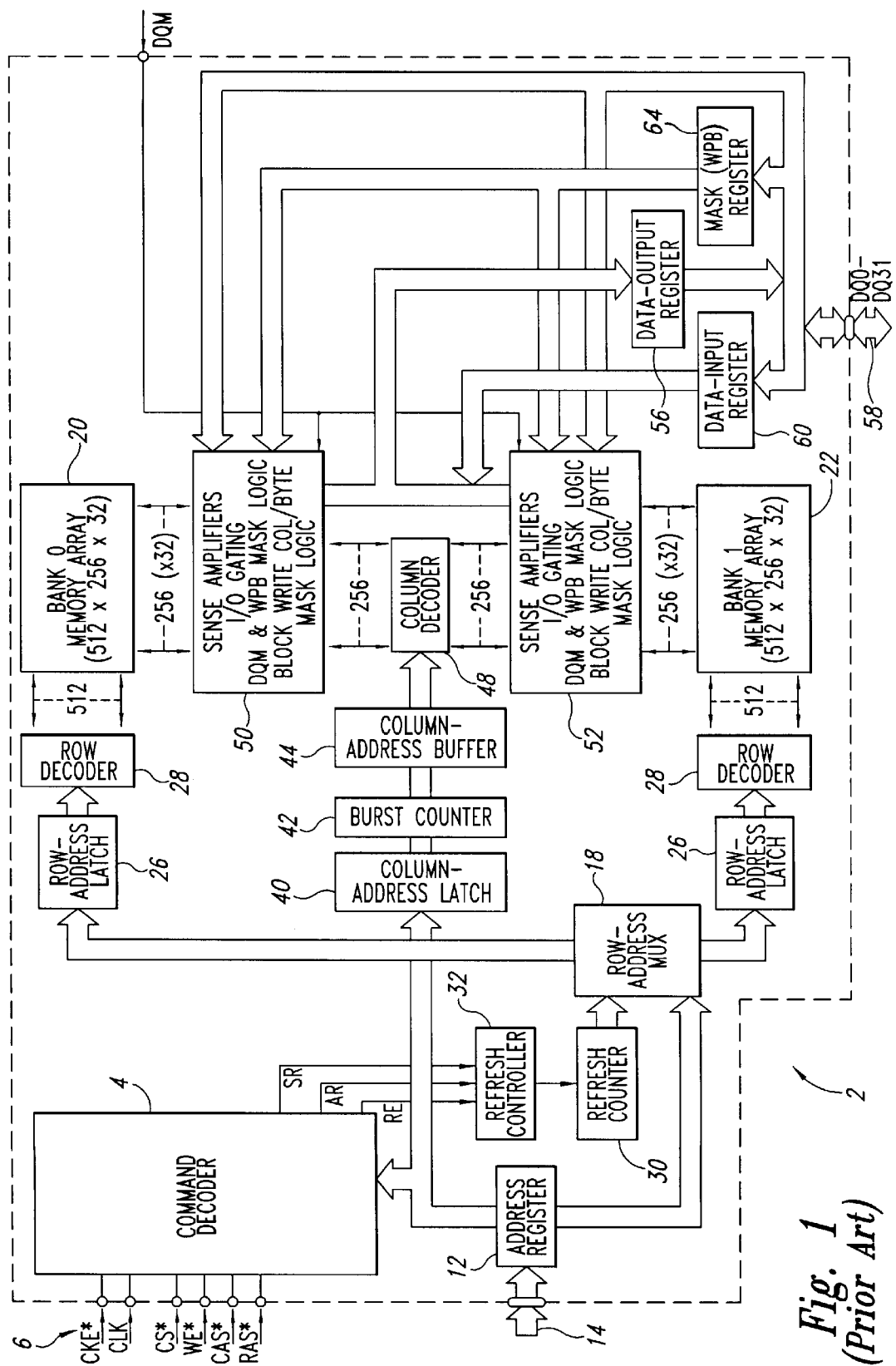
FIG. 1 is a block diagram of a prior art synchronous random access memory ("SDRAM") that may advantageously use one embodiment of a refresh command generator in accordance with the invention.
Figure 2:
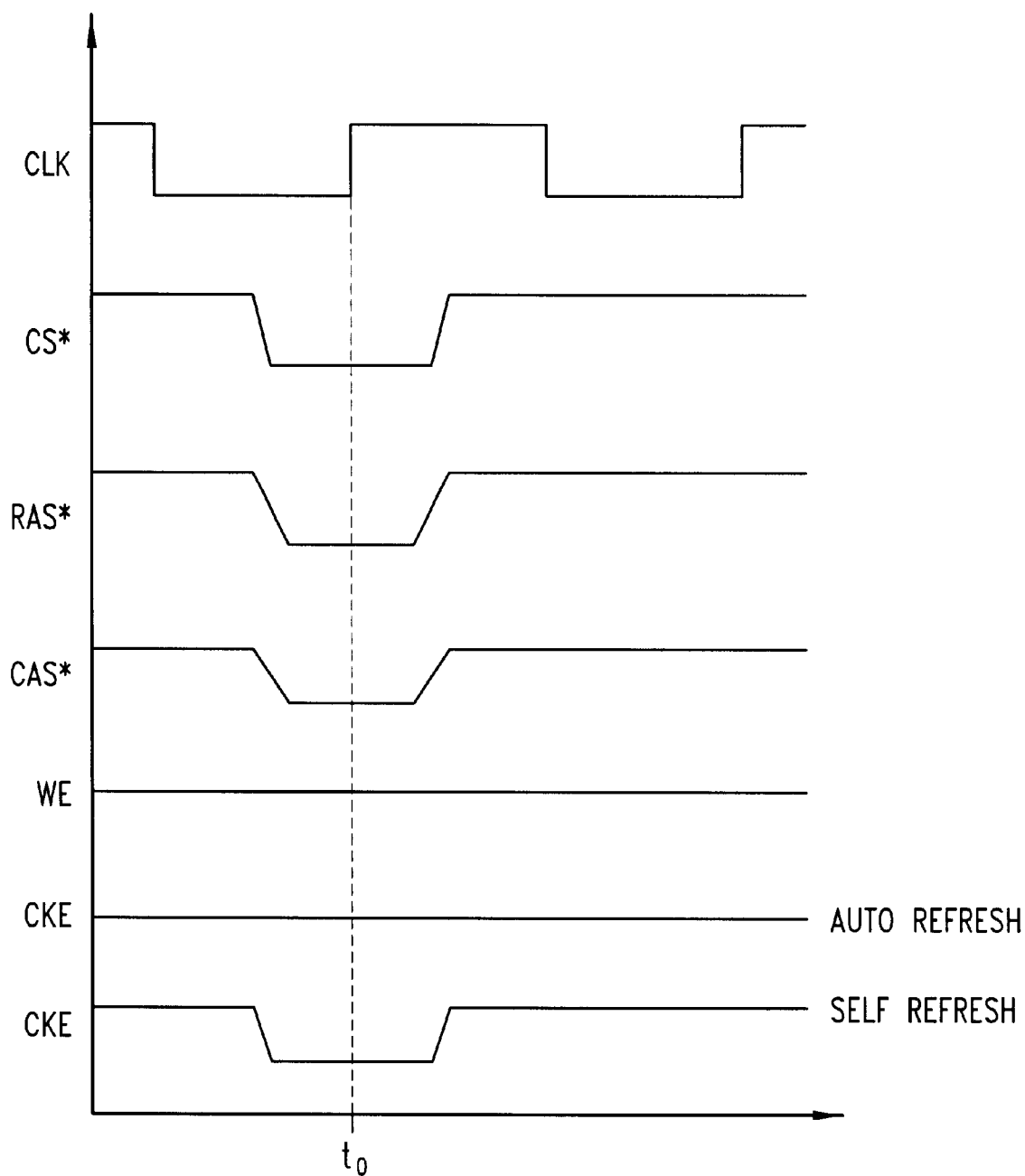
FIG. 2 is a timing diagram showing control signals used by a command decoder to provide auto refresh and self refresh commands to a refresh controller in the SDRAM of FIG. 1.
Figure 3:
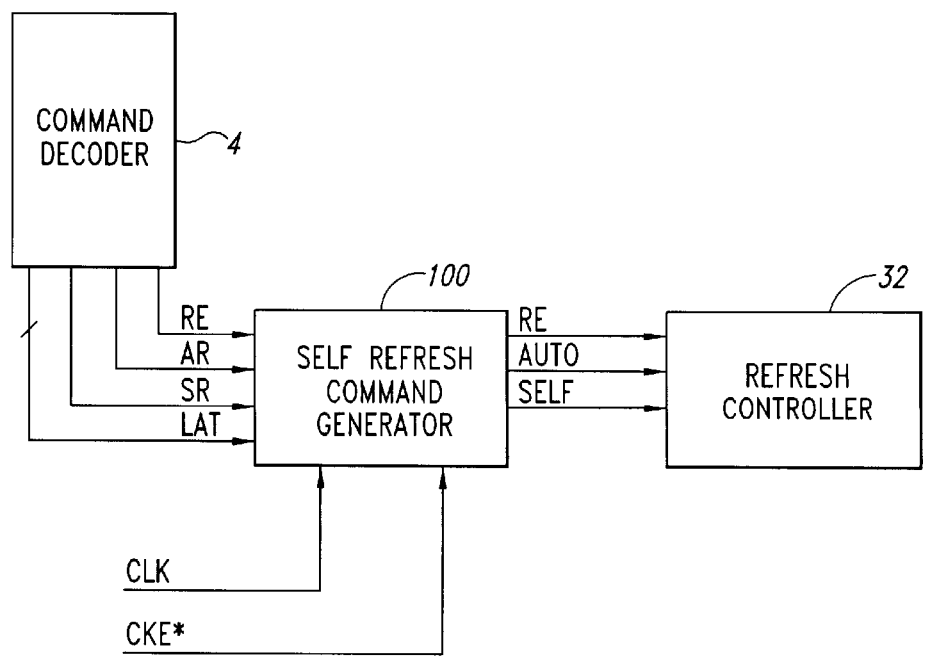
FIG. 3 is a block diagram showing the manner in which one embodiment of a self refresh command generator according to the invention is integrated into the SDRAM of FIG. 1.

One embodiment of a self refresh command generator 100 for generating a self refresh command despite a substantially delayed CKE signal is illustrated in FIG. 3. The self refresh command generator 100 is connected between the SDRAM command decoder 4 and the SDRAM refresh controller 32 (FIG. 1). The command decoder 4 supplies the self refresh command generator 100 with the auto refresh command AR and a latency value LAT, the purpose of which will be explained below. The self refresh controller 100 also receives the clock signal CLK and the clock enable signal CKE*. The self refresh command generator 100 applies either an auto refresh command AUTO or a self refresh command SELF to the refresh controller 32. As will be understood, the self refresh controller 100 can generate the self refresh command SELF responsive to receiving the auto refresh command AR from the command decoder 4 and CKE being low.

Figure 4:
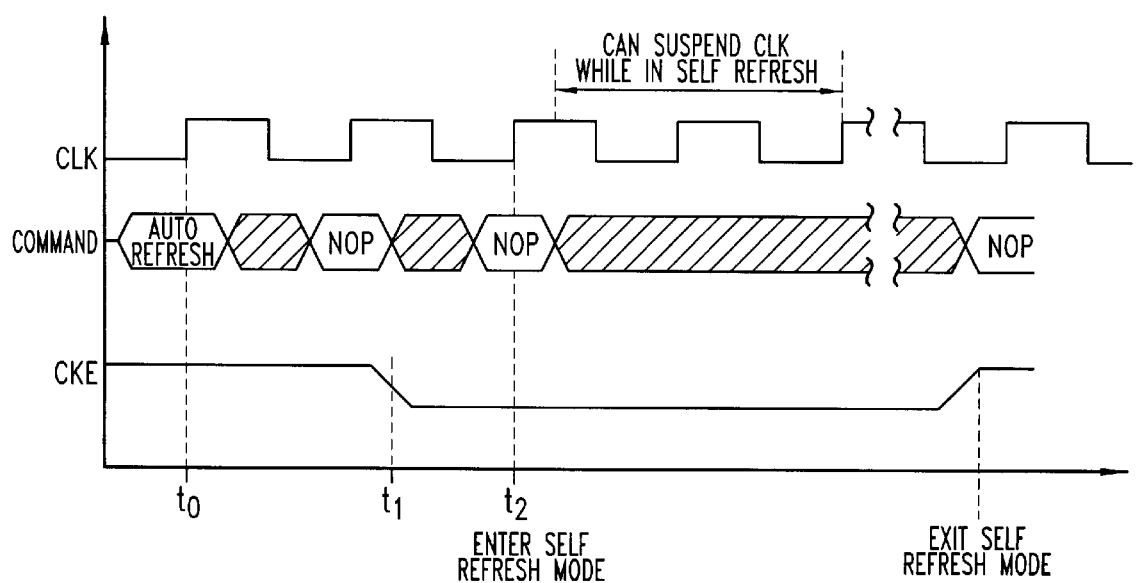
FIG. 4 is a timing diagram showing the operation of the self refresh command generator of FIG. 3.

The manner in which the self refresh command generator 100 is able to apply the self refresh command SELF to the refresh controller 32 despite a substantially delayed CKE signal is illustrated in FIG. 4. As shown in FIG. 4, the SDRAM command decoder decodes control signals corresponding to an auto refresh command and outputs an auto refresh command AR at time $t_0$. Although the external device generating the control signals actually generated the control signals for a self refresh command, CKE has not transitioned low at $t_0$ because of the capacitive loading of the CKE signal. As a result, at the leading edge of the clock at $t_0$, the command decoder is not able to determine that a self refresh command should be generated. In fact, it is not until more than one clock cycle later that CKE finally transitions low at $t_1$. However, the self refresh command generator 100 provides a "window" starting at $t_0$ when the auto refresh command is registered with the leading edge of CLK. If CKE goes low at any time during this window, the self refresh command generator 100 will generate the self refresh command SELF. As illustrated in FIG. 4, the "window" or self refresh latency in which CKE may transition low to generate a self refresh command SELF is two clock cycles, i.e., until $t_2$. However, a shorter or longer self refresh latency may be provided. In fact, in the embodiment shown on FIG. 3, the latency is determined by the latency signal LAT, although, of course, the self refresh latency may be fixed. Thus, in accordance with the embodiment of the invention illustrated in FIG. 3, as long as CKE transitions low during the self refresh latency, the self refresh command generator 100 will generate a self refresh command SELF. Thereafter, the refresh controller 32 will enter the self refresh mode.

Insofar as the initial functions of the auto refresh mode and self refresh mode are substantially identical, the embodiment of the self refresh command generator 100 illustrated in FIG. 3 causes the auto refresh controller 32 to enter the auto refresh mode when the auto refresh command AUTO is generated. Thereafter, when the self refresh command SELF is generated, the refresh controller 32 transitions from the auto refresh mode to the self refresh mode. However, it will be understood that the operation of the refresh controller 32 could be altered so that it delays responding to the auto refresh mode until after the self refresh latency so that the refresh controller will enter either the auto refresh mode or the self refresh mode, but not the auto refresh mode and then the self refresh mode in sequence. However, operating in this manner would undesirably increase the time required for the refresh controller 32 to be placed in the auto refresh mode.

Figure 5:
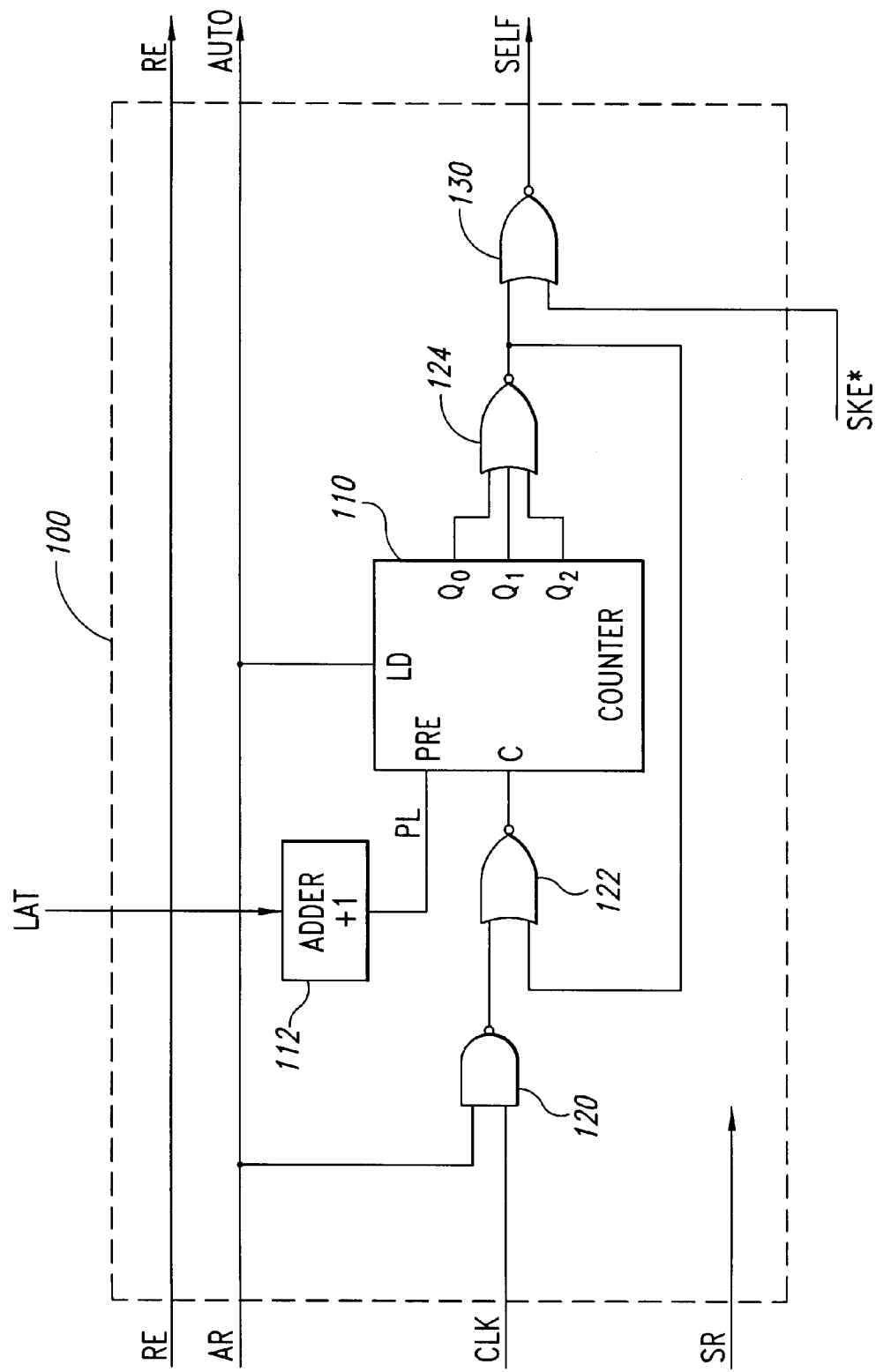
FIG. 5 is a logic diagram of the self refresh command generator of FIG. 3.

One embodiment of a self refresh command generator 100 is illustrated in FIG. 5. The duration of the self refresh latency is controlled by a down counter 110 which is preloaded with a preload value PL. The preload value PL is generated by an adder 112 which adds a value of 1 to the latency value LAT. The number of bits in the latency value LAT will, of course, depend upon the range at which the latency can be varied. However, two bits will generally suffice. The reason for adding 1 to the latency value LAT will be explained below. Thereafter, when the SDRAM command decoder generates the auto refresh command AR, the low to high transition applied to the load LD input of the counter 110 causes the counter 110 to load the preload value PL. The low to high transition of AR also enables a NAND gate 120 which then couples the clock signal CLK to one input of a NOR gate 122. The other input of the NOR gate is generated by a NOR gate 124 which decodes the terminal count of the counter 110 which is zero. Thus, since the preload value PRE cannot be zero (because of the adder 112), at least one of the inputs to the NOR gate 124 will initially be high, thus making the output of the NOR gate 124 initially low to enable the NOR gate 122. Therefore, when the AR command is generated, the clock signal CLK is coupled through the NAND gate 120 and the NOR gate 122 to the clock input C of the counter 110. The clock 110 then decrements for a number of clock cycles depending upon the value of LAT. When the zero terminal count is reached, the output of the NOR gate 124 goes high thereby disabling the NOR gate 122 and preventing additional clock signal CLK from reaching the clock input of the counter 110.

For this reason, the counter 110 is held at the zero terminal count until it is once again preloaded. Thus, the output of the NOR gate 124 is initially low, and it remains low until the terminal count of the counter 110 is reached. Thereafter, the output of the NOR gate 124 remains high because the counter 110 is held at the terminal count.

The low at the output of the NOR gate 124 is applied to one input of a NOR gate 130 which also receives the CKE* signal. The output of the NOR gate 130 generates the self refresh command SELF whenever both of its inputs are low. Thus, the SELF command will be generated whenever CKE* goes low during the latency period extending from the AR command and the terminal count of the counter 110. Consequently, as long as the CKE* goes low before the terminal count of the counter 110 is reached, the self refresh command SELF will be generated.

Although a latency value LAT of one or more clock cycles will generally be desired, the self refresh command generator 100 is capable of operating in a conventional manner in which CKE must be low at the same time the remaining control signals for the self refresh command are active. It is for this reason that the adder 112 increments the latency value LAT by one. More specifically, if LAT is zero, the adder 112 causes the counter 110 to be loaded with one. As a result, the output of the NOR gate 124 is initially low thereby enabling the NOR gate 130. Thus, if CKE is also low at the time AR goes high, a self refresh command will be generated. If the latency value LAT was coupled directly to the preload input PRE of the counter 110, then the counter would be preset to zero when the high AR command was generated, thereby disabling the NOR gate 130. As a result, the NOR gate 130 could not generate the self refresh command SELF even if CKE* was low when the high AR command was received.

As mentioned above, the latency value LAT is generated by the command decoder 4 (FIGS. 1 and 3) in a conventional manner. For example, the value of LAT could be permanently or temporarily programmed into a storage device (not shown) in the SDRAM2 at the same time that a mode register in the command decoder 4 is programmed to select various operating modes. Also, the value of LAT could be determined by a decoder circuit (not shown) in the command decoder 4 that decodes various input terminals that are not normally used at the time an auto refresh command is issued. For example, the address inputs could be used for this purpose.

Although FIG. 5 illustrates one logic circuit for causing the self refresh command generator 100 to function as explained above with reference to FIG. 4, other logic circuits may also be used. Also, although the preferred embodiment of the invention has been explained with reference to generating a self refresh command in a SDRAM, it will be understood that it is applicable to other control signals used in the SDRAM 10, other memory devices such as asynchronous DRAMs and SRAMs, other synchronous memory devices such as SyncLight, SyncLink or RAMBUS memory devices, and other integrated circuits generally in which one or more signals in a combination of signals may be out of synchronism. Also, although the preferred embodiment of the invention has been explained with reference to a signal that is delayed with respect to other signals corresponding to the command, it will be understood that it is also applicable to signals applied too early, i.e., before the other signals of a command.

Figure 6:
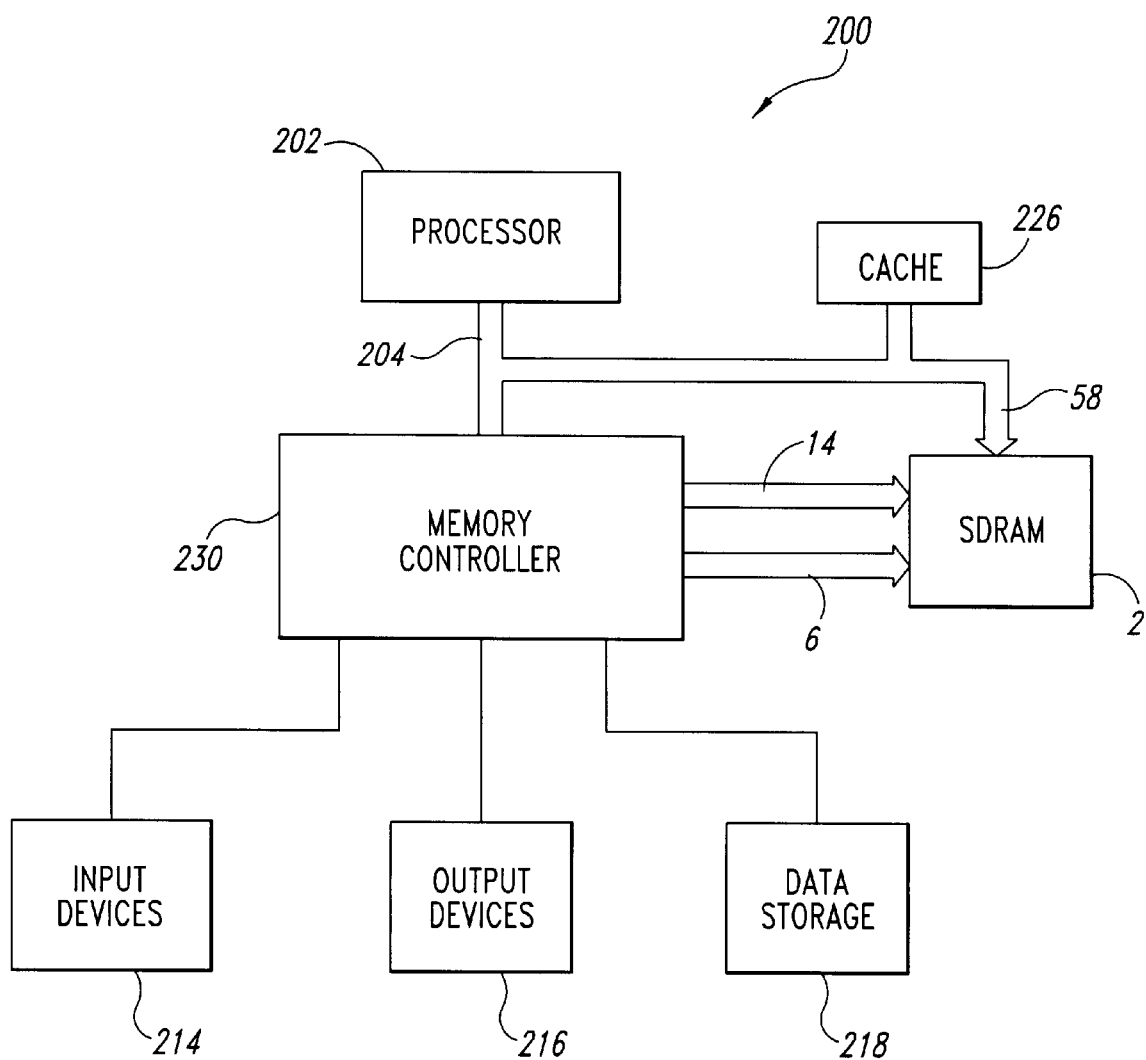
FIG. 6 is a block diagram of a computer system using the SDRAM of FIG. 1 including the self refresh command generator of FIG. 5 as shown in FIG. 3.

FIG. 6 shows a computer system 200 containing the SDRAM 2 of FIG. 1 using the self refresh command generator 100 of FIG. 5 in the manner shown in FIG. 3. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 2 through a memory controller 230. The memory controller 230 normally includes the control bus 6 and the address bus 14 that are coupled to the SDRAM 2. The data bus 58 may be coupled to the processor bus 204 either directly (as shown), through the memory controller 230, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A command generator causing an integrated circuit to perform first and second functions responsive to respective first and second command signals, comprising:
   a first decoder circuit coupled to at least some of a plurality of control input terminals of the integrated circuit, the first decoder circuit generating the first command signal responsive to receiving and decoding a first combination of control signals applied to the control input terminals; and
   a second decoder circuit coupled to the first decoder circuit and to at least some of the plurality of control input terminals, the second decoder circuit generating the second command signal responsive to receiving the first command signal and receiving and decoding the second combination of control signals with predetermined criteria.

2. The command generator of claim 1 wherein the integrated circuit comprises a synchronous dynamic random access memory.

3. A memory device, comprising:
   at least one array of memory cells adapted to store data at a location determined by a row address and a column address;
   a row address circuit adapted to receive and decode the row address, and select a row of memory cells corresponding to the row address;
   a column address circuit adapted to receive or apply data to one of the memory cells in the selected row corresponding to the column address;
   a data path circuit adapted to couple data between an external terminal and the column address circuit; and
   a command generator coupled to a plurality of control input terminals and generating a sequence of command signals for causing the memory device to read data from and write data to the memory cells in the array corresponding to the selected row and column, the command generator further causing the memory device to perform first and second functions responsive to respective first and second command signals, comprising:
      a first decoder circuit coupled to at least some of a plurality of control input terminals of the integrated circuit, the first decoder circuit generating the first command signal responsive to receiving and decoding a first combination of control signals applied to the control input terminals; and
      a second decoder circuit coupled to the first decoder circuit and to at least some of the plurality of control input terminals, the second decoder circuit generating the second command signal responsive to receiving the first command signal and receiving and decoding the second combination of control signals with predetermined criteria.

4. The memory device of claim 3 wherein the memory device comprises a synchronous dynamic random access memory.

5. A synchronous random access memory ("SDRAM"), comprising:
   at least one array of memory cells adapted to store data at a location determined by a row address and a column address;
   a row address circuit adapted to receive and decode the row address, and select a row of memory cells corresponding to the row address;
   a column address circuit adapted to receive or apply data to one of the memory cells in the selected row corresponding to the column address;
   a data path circuit adapted to couple data between an external terminal and the column address circuit; and
   a refresh generator causing the memory cells in the array to be refreshed, the refresh generator causing the dynamic random access memory to perform an auto refresh operation responsive to an auto refresh command and to perform a self refresh operation responsive to a self refresh command;
   a command generator coupled to a plurality of control input terminals and generating a sequence of command signals responsive to a clock signal for causing the memory device to read data from and write data to the memory cells in the array corresponding to the selected row and column in synchronism with the clock signal, the command generator further generating the auto refresh command and the self refresh command, the command generator comprising:
      a first decoder circuit coupled to at least some of a plurality of control input terminals of the integrated circuit, the first decoder circuit generating the auto refresh command responsive to receiving and decoding a combination of control signals applied to the control input terminals corresponding to the auto refresh command; and
      a second decoder circuit coupled to the first decoder circuit and to at least some of the plurality of control input terminals, the second decoder circuit generating the self refresh command responsive to receiving the auto refresh command and receiving and decoding a combination of control signals applied to the control input terminals corresponding to the self refresh command with predetermined criteria.

6. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a memory device coupled to the processor bus adapted to allow data to be stored, the memory device comprising:

at least one array of memory cells adapted to store data at a location determined by a row address and a column address;

a row address circuit adapted to receive and decode the row address, and select a row of memory cells corresponding to the row address;

a column address circuit adapted to receive or apply data to one of the memory cells in the selected row corresponding to the column address;

a data path circuit adapted to couple data between an external terminal and the column address circuit; and a command generator coupled to a plurality of control input terminals and generating a sequence of command signals for causing the memory device to read data from and write data to the memory cells in the array corresponding to the selected row and column, the command generator further causing the memory device to perform first and second functions responsive to respective first and second command signals, comprising:

a first decoder circuit coupled to at least some of a plurality of control input terminals of the integrated circuit, the first decoder circuit generating the first command signal responsive to receiving and decoding a first combination of control signals applied to the control input terminals; and a second decoder circuit coupled to the first decoder circuit and to at least some of the plurality of control input terminals, the second decoder circuit generating the second command signal responsive to receiving the first command signal and receiving and decoding the second combination of control signals with predetermined criteria.

7. The computer system of claim 6 wherein the memory device comprises a synchronous dynamic random access memory.

8. A method of causing a synchronous dynamic random access memory ("SDRAM") to operate in either an auto refresh mode or a self refresh mode, comprising:

decoding control signals applied to the SDRAM;

determining if control signals applied to the SDRAM correspond to an auto refresh command;

if control signals applied to the SDRAM correspond to an auto refresh command, causing the SDRAM to operate in the auto refresh mode;

after determining that control signals applied to the SDRAM correspond to an auto refresh command, continuing to decode control signals applied to the SDRAM; and if control signals applied to the SDRAM with predetermined criteria correspond to a self refresh command, causing the SDRAM to operate in the self refresh mode.

9. The method of claim 8 wherein the auto refresh command comprises row address strobe, column address strobe, chip select, and clock enable, and wherein the self refresh command comprises row address strobe, column address strobe, and chip select.

10. The method of claim 8 wherein the predetermined criteria is the time between receiving the auto refresh command and receiving the self refresh command.

11. The method of claim 8 wherein the predetermined criteria is the number of clock periods occurring between receiving the auto refresh command and receiving the self refresh command.

* * * * *